United States Patent
Binnard et al.

(10) Patent No.: US 6,842,248 B1
(45) Date of Patent: Jan. 11, 2005

(54) SYSTEM AND METHOD FOR CALIBRATING MIRRORS OF A STAGE ASSEMBLY

(75) Inventors: Mike Binnard, Belmont, CA (US); Masahiko Okumura, Tokyo (JP)

(73) Assignee: Nikon Corporation, Tokyo (JP)

(*) Notice: Subject to any disclaimer, the term of this patent is extended or adjusted under 35 U.S.C. 154(b) by 314 days.

(21) Appl. No.: 09/724,146

(22) Filed: Nov. 28, 2000

(51) Int. Cl.[7] .......................... G01B 11/00; G01B 11/02; G03B 27/42; G03B 27/38

(52) U.S. Cl. .......................... 356/401; 356/500; 355/53; 355/72

(58) Field of Search .......................... 356/399–401, 356/620, 500, 509, 510; 355/53, 55, 72; 250/548; 430/22, 30

(56) References Cited

U.S. PATENT DOCUMENTS

| | | | | |
|---|---|---|---|---|
| 4,897,553 A | * | 1/1990 | Nishi | 250/548 |
| 5,243,195 A | * | 9/1993 | Nishi | 250/548 |
| 5,417,408 A | * | 5/1995 | Ueda | 269/21 |
| 5,523,841 A | * | 6/1996 | Nara et al. | 356/500 |
| 5,715,064 A | | 2/1998 | Lin | |
| 6,057,921 A | * | 5/2000 | Yao | 356/500 |
| 6,285,444 B1 | * | 9/2001 | Osanai et al. | 355/72 |
| 6,285,457 B2 | * | 9/2001 | Ukaji | 356/500 |
| 6,404,505 B2 | * | 6/2002 | Matsui | 356/620 |
| 6,495,847 B1 | * | 12/2002 | Asano et al. | 250/548 |
| 6,509,957 B1 | | 1/2003 | Tanaka | |
| 2002/0026878 A1 | | 3/2002 | Kwan et al. | |

FOREIGN PATENT DOCUMENTS

WO    WO 200022376 A1 *   4/2000 .......... G01B/11/24

* cited by examiner

Primary Examiner—Zandra V. Smith
Assistant Examiner—Gordon J. Stock, Jr.
(74) Attorney, Agent, or Firm—Oliff & Berridge PLC

(57) ABSTRACT

A stage assembly (10) for moving and positioning a device (26) is provided herein. The stage assembly (10) includes a stage base (12), a device table (48), a stage mover assembly (16), a measurement system (20), and a control system (22). The stage mover assembly (16) moves the device table (48) along an X axis, along a Y axis, and about a Z axis relative to the stage base (12). The measurement system (20) includes a first X mirror (25A) for monitoring the position of the device table (48) in an alignment position (31A) and a second X mirror (25B) for monitoring the position of the device table (48) in an operational position (31B). In one embodiment, the stage assembly (10) includes a first fiducial mark (76) and a second fiducial mark (78) that are secured to the device table (48) to determine the relative position of the X mirrors (25A)(25B). Alternately, in another embodiment, the stage assembly additionally includes a third fiducial mark (80) secured to the device table (48) for determining the relative positions of the X mirrors (25A) (25B). In both embodiments, the control system (22) utilizes the measured position of the fiducial marks relative to the first X mirror (25A) and the second X mirror (25B) to determine the position of the first X mirror (25A) relative to the second X mirror (25B). These features allow for more accurate positioning of the device (26) by the stage assembly (10) and better performance of the stage assembly (10).

37 Claims, 11 Drawing Sheets

SYSTEM AND METHOD FOR CALIBRATING MIRRORS OF A STAGE ASSEMBLY

FIELD OF THE INVENTION

The present invention is directed to a stage assembly for moving a device. More specifically, the present invention is directed to a method and system for calibrating mirrors on a device table of a stage assembly.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly, a wafer stage assembly that retains a semiconductor wafer, and a measurement system. The reticle stage assembly and the wafer stage assembly are supported above a ground with an apparatus frame.

Recently, in order to increase the throughput of the exposure apparatus, wafer stage assemblies have been developed that include two wafer tables. In this design, each of the wafer tables retains a wafer. Further, a wafer mover assembly independently and alternately moves each wafer table with its wafer between an alignment position and an operational position. In the alignment position, the wafer is loaded onto the wafer table and the position of the chips on the wafer relative to the wafer table is determined. In the operational position, the images from the reticle are transferred to the wafer.

The size of the images transferred onto the wafer from the reticle is extremely small. Accordingly, the precise relative positioning of the wafer and the reticle is critical to the manufacturing of high density, semiconductor wafers.

In order to obtain precise relative positioning, the reticle and the wafer are constantly monitored by the measurement system. Stated another way, the measurement system monitors movement of each wafer table relative to the lens assembly or some other reference. With this information, the wafer mover assembly can be used to precisely position the wafer tables.

The measurement system typically includes one or more interferometers for monitoring the position of each wafer table. Typically, in the wafer stage assemblies that include only one wafer table, a first X interferometer system and a Y interferometer system are used to monitor the position of the wafer table in both the alignment position and the operational position. However, for wafer stage assemblies that include two wafer tables, a second X interferometer system is often necessary. In this design, the first X interferometer monitors the position of the wafer table along an X axis when the wafer table and the wafer is in the alignment position and the second X interferometer monitors the position of the wafer table along the X axis when the wafer table and the wafer is in the operational position. Further, the Y interferometer monitors the position of the wafer table and the wafer along a Y axis and about a Z axis when the wafer table is in both the alignment position and the operational position.

For each device table, the first X interferometer includes a first X mirror, the second X interferometer includes a second X mirror, and the Y interferometer includes a Y mirror. Each of the mirrors is secured to the device table. Unfortunately, the first X mirror and the second X mirror are not perfectly parallel. As a result thereof, the relationship between measurements taken with the first X interferometer and measurements taken with the second X interferometer is not precisely known. This reduces the accuracy of positioning of the wafer relative to the reticle and degrades the accuracy of the exposure apparatus.

In light of the above, one object of the present invention is to provide a stage assembly that precisely positions a device. Another object is to provide a method and system for determining the exact relative positions of the first X mirror and the second X mirror on each wafer table. Yet another object is to provide an exposure apparatus capable of manufacturing precision devices such as high density, semiconductor wafers.

SUMMARY

The present invention is directed to a stage assembly for moving a device relative to a stage base that satisfies these needs. The stage assembly includes a device table, a stage mover assembly, a measurement system, and a control system. The device table retains the device. The stage mover assembly is connected to the device table and moves the device table relative to the stage base. The measurement system includes a first X mirror used for monitoring the position of the device table in an alignment position and a second X mirror used for monitoring the position of the device table in an operational area. Additionally, the measurement system includes a Y mirror that is used for monitoring the position of the device table along a Y axis. The mirrors are secured to the device table.

Uniquely, the control system accurately determines the position of the first X mirror relative to the second X mirror. As a result thereof, the control system can determine the relationship between measurements taken by the measurement system in the alignment position and in the operational position. Further, the stage assembly can be used in an exposure apparatus to manufacture high density, high quality semiconductor wafers.

A couple of embodiments for determining the relative positions of the X mirrors are provided herein. In one embodiment, the stage assembly includes a first fiducial mark and a second fiducial mark that are secured to the device table. In this embodiment, the control system utilizes the first fiducial mark and the second fiducial mark to determine the position of the first X mirror relative to the second X mirror. More specifically, the measurement system measures (i) the position of the first fiducial mark relative to the first X mirror, the second X mirror, and the Y mirror, and (ii) the position of the second fiducial mark relative to the first X mirror, the second X mirror, and the Y mirror. Further, the control system utilizes (i) the measured position of the first fiducial mark relative to the mirrors, and (ii) the measured position of the second fiducial mark relative to the mirrors to determine the position of the first X mirror relative to the second X mirror.

In the other embodiment, the stage assembly additionally includes a third fiducial mark that is secured to the device table. In this embodiment, the control system utilizes the first fiducial mark, the second fiducial mark and the third fiducial mark to determine the position of the first X mirror relative to the second X mirror. More specifically, the measurement system measures (i) the position of the first fiducial mark relative to the first X mirror, the second X mirror, and the Y mirror, (ii) the position of the second fiducial mark relative to the first X mirror, the second X mirror, and the Y mirror, and (iii) the position of the third fiducial mark relative to the first X mirror, the second X mirror, and the Y mirror. Further, the control system utilizes (i) the measured position of the first fiducial mark relative to the mirrors, (ii) the measured position of the second fiducial mark relative to the mirrors, and (iii) the measured position of the third fiducial mark relative to the mirrors to determine the position of the first X mirror relative to the second X mirror.

The present invention is also directed to a method for making a stage assembly, a method for making an exposure apparatus, a method for making a device, a method for manufacturing a wafer, and a method of determining the relative positions of a first X mirror and a second X mirror.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
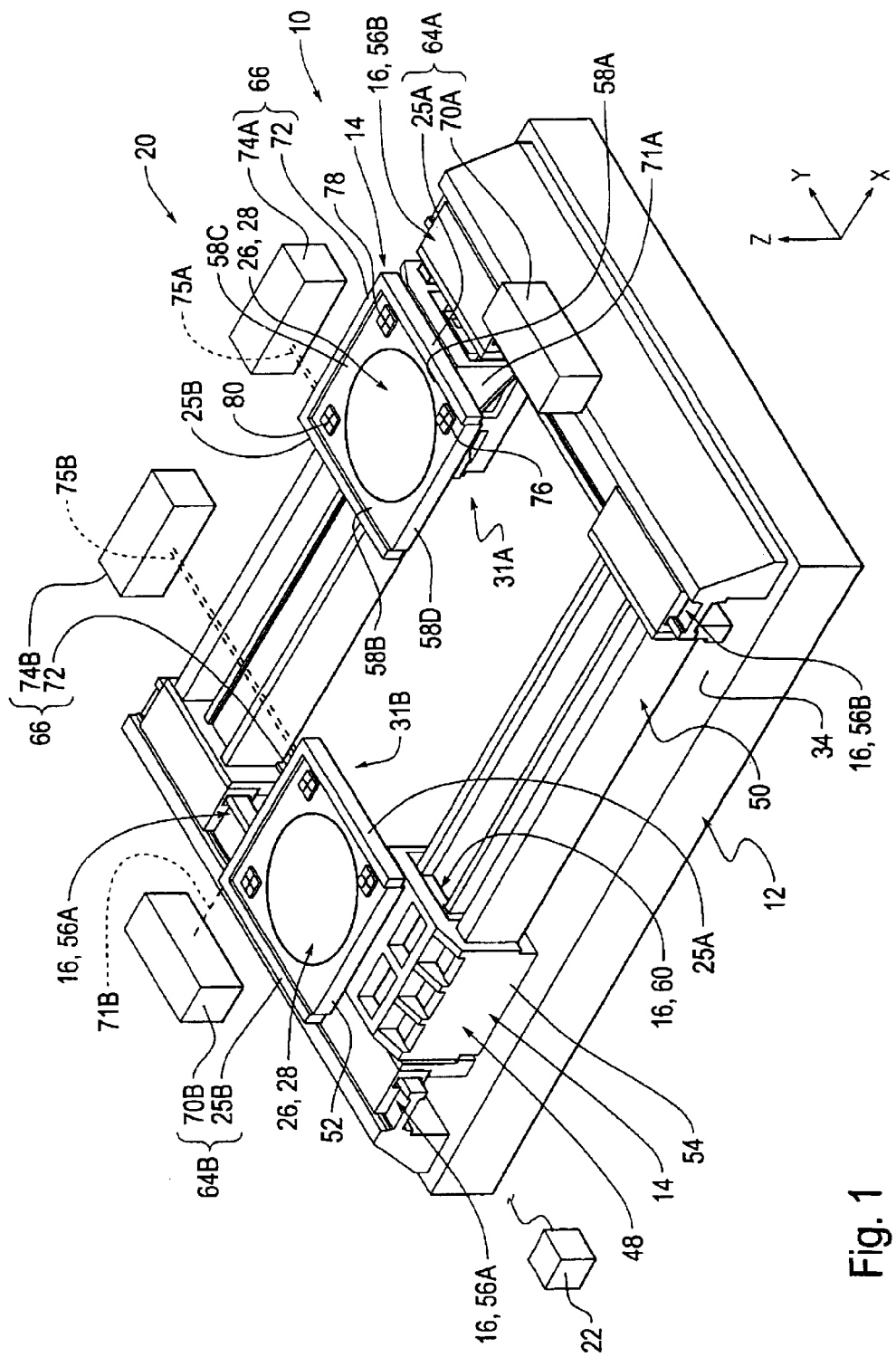
FIG. 1 is a perspective view of a stage assembly having features of the present invention.
Figure 2:
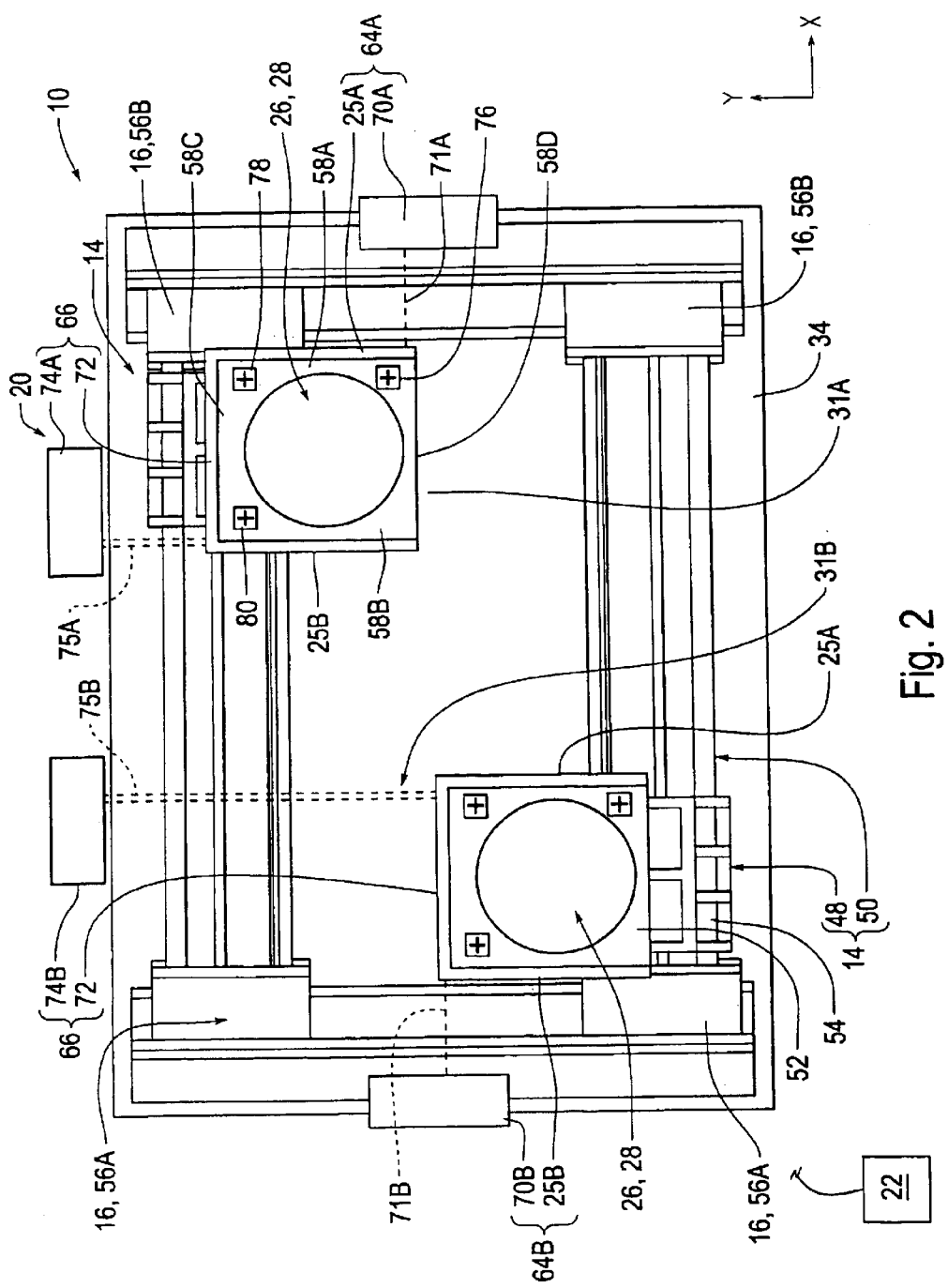
FIG. 2 is a top plan view of the stage assembly of FIG. 1.
Figure 3:
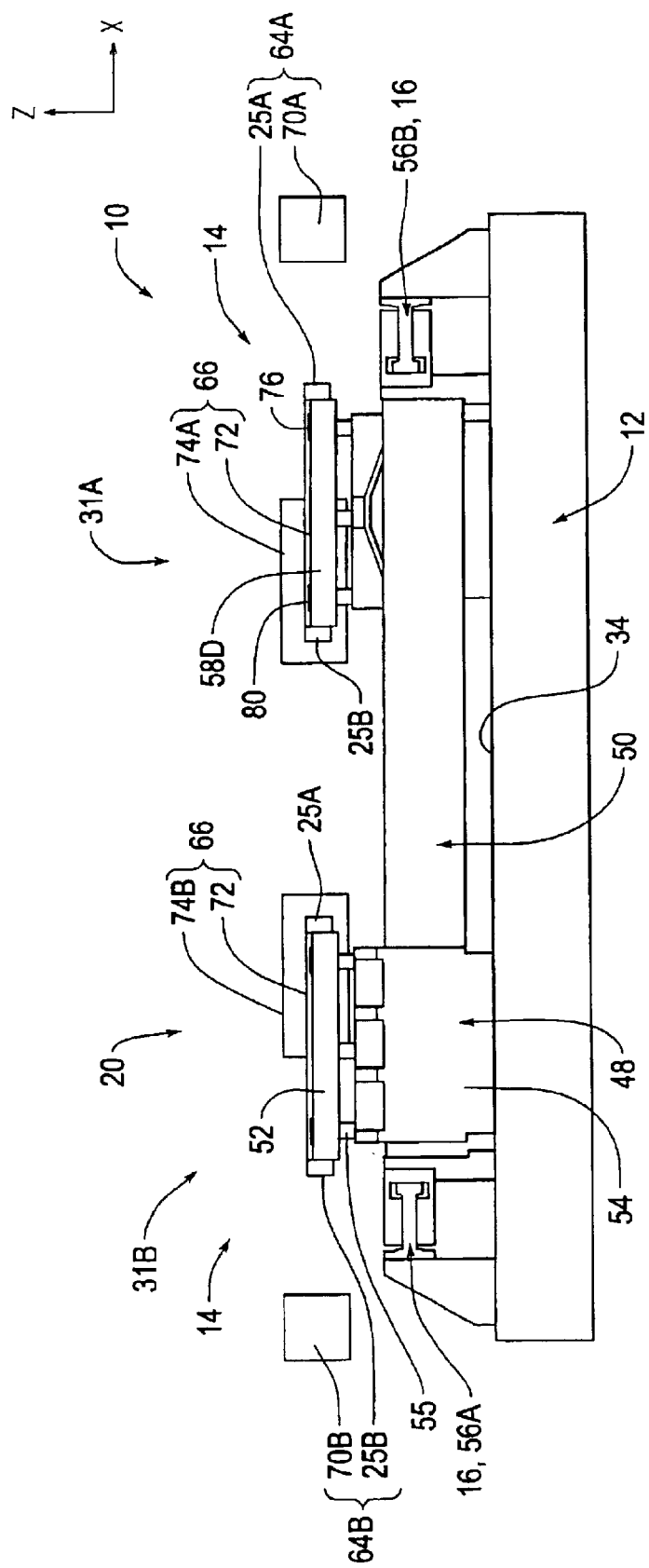
FIG. 3 is a side plan view of the stage assembly of FIG. 1.
Figure 4:
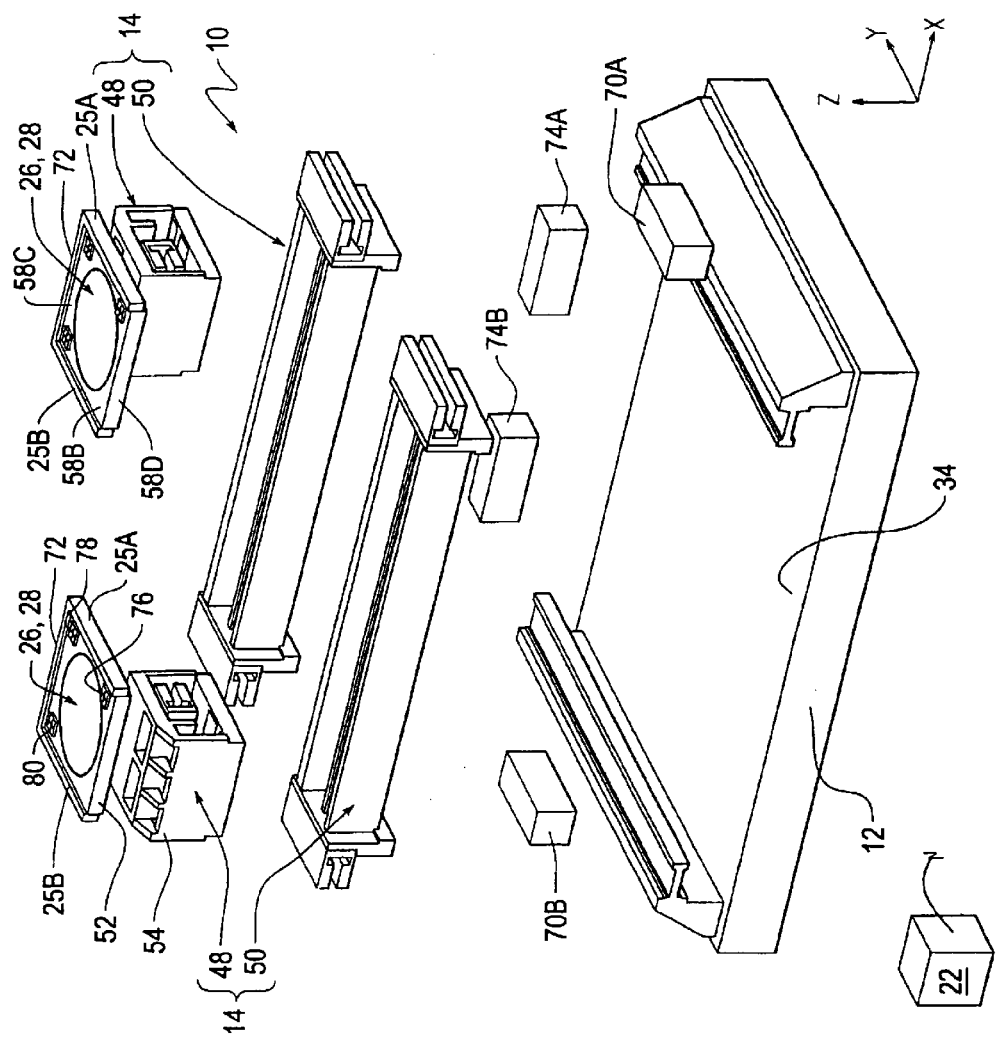
FIG. 4 is an exploded perspective view of the stage assembly of FIG. 1.

Referring initially to FIGS. 1–4, a stage assembly 10 having features of the present invention, includes a stage base 12, at least one stage 14 (two are illustrated), a stage mover assembly 16, a measurement system 20, and a control system 22. The stage assembly 10 is positioned above a mounting base 24 (illustrated in FIG. 7). As an overview, the measurement system 20, for each stage 14, includes a first X mirror 25A and a spaced apart second X mirror 25B that are secured to each stage 14. The present invention provides a couple of methods that can be used by the control system 22 for accurately determining the position of the first X mirror 25A relative to the second X mirror 25B for each stage 14. As a result thereof, the measurement system 20 can accurately monitor the position of each stage 14 and the stage mover assembly 16 can precisely position each stage 14.

The stage assembly 10 is useful for precisely positioning a device 26 during a manufacturing and/or an inspection process. The type of device 26 positioned and moved by the stage assembly 10 can be varied. For example, the device 26 can be a semiconductor wafer 28, and the stage assembly 10 can be used as part of an exposure apparatus 30 (illustrated in FIG. 7) for precisely positioning the semiconductor wafer 28 relative to a reticle 32 (illustrated in FIG. 7) during manufacturing of the semiconductor wafer 28. Alternately, for example, the stage assembly 10 can be used to move other types of devices during manufacturing and/or inspection, to move a device under an electron microscope (not shown), or to move a device during a precision measurement operation (not shown).

The stage assembly 10 provided herein is particularly useful for independently and alternately moving two wafers 28 between an alignment position 31A and an operational position 31B. Each of the wafers 28 includes a plurality of chip alignment marks (not shown) that identify the location of the chips (not shown) on the wafers 28. In the alignment position 31A, the wafer 28 is positioned on the respective stage 14. Subsequently, in the alignment position 31A, an alignment device 33, e.g. a microscope, (illustrated in FIG. 7) is used to align and determine the position of the wafer alignment marks of the wafer 28 relative to the stage 14. In the operational position 31B, a projection device 36, e.g. a projection microscope, (illustrated in FIG. 7) is used to check alignment of the wafer 28 relative to the reticle 32 through an optical assembly 200 (illustrated in FIG. 7) of the exposure apparatus 30. Subsequently, in the operational position 31B, images from the reticle 32 are transferred to the wafer 28.

Some of the Figures provided herein include a coordinate system that designates an X axis, a Y axis, and a Z axis. It should be understood that the coordinate system is merely for reference and can be varied. For example, the X axis can be switched with the Y axis and/or the stage assembly 10 can be rotated.

Figure 5A:
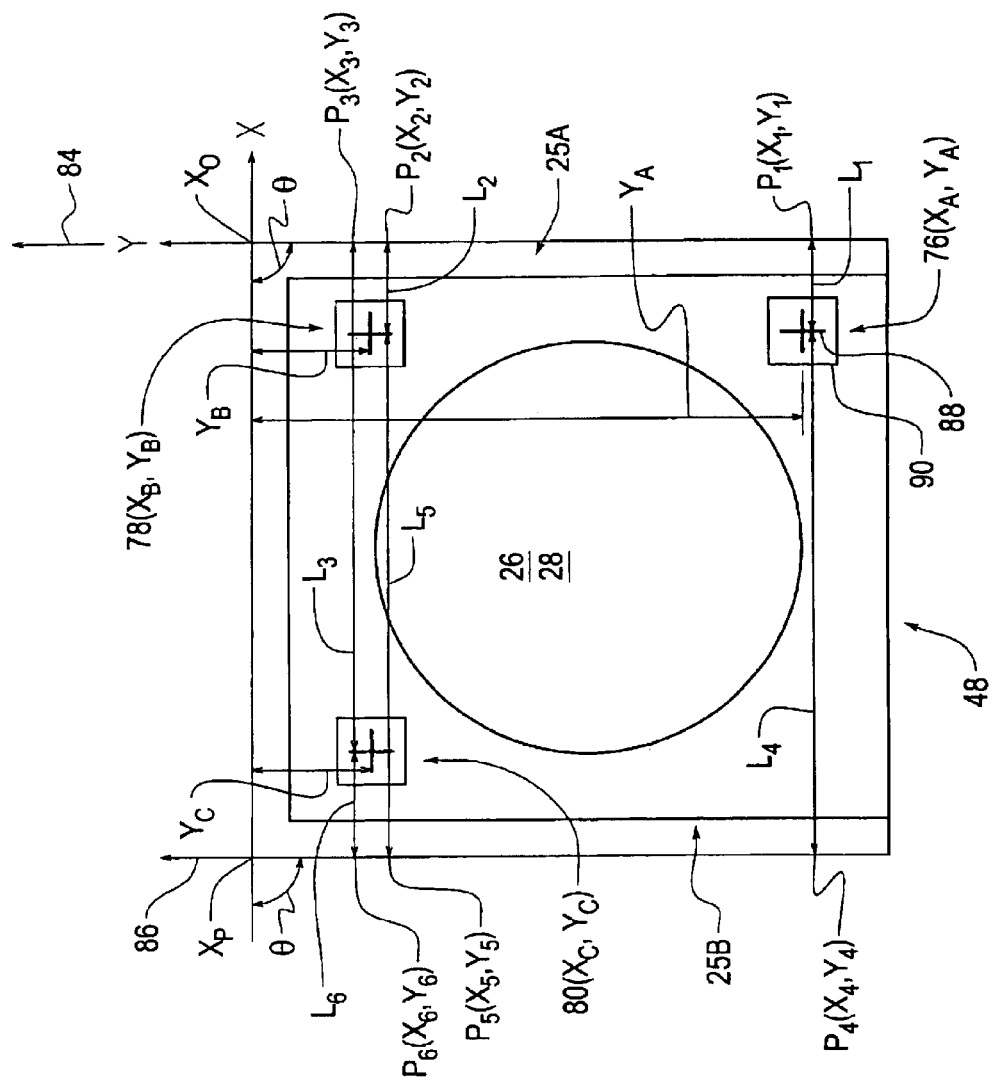
FIG. 5A is a top plan view of a device table that facilitates a discussion of a first system and method having features of the present invention.
Figure 5B:
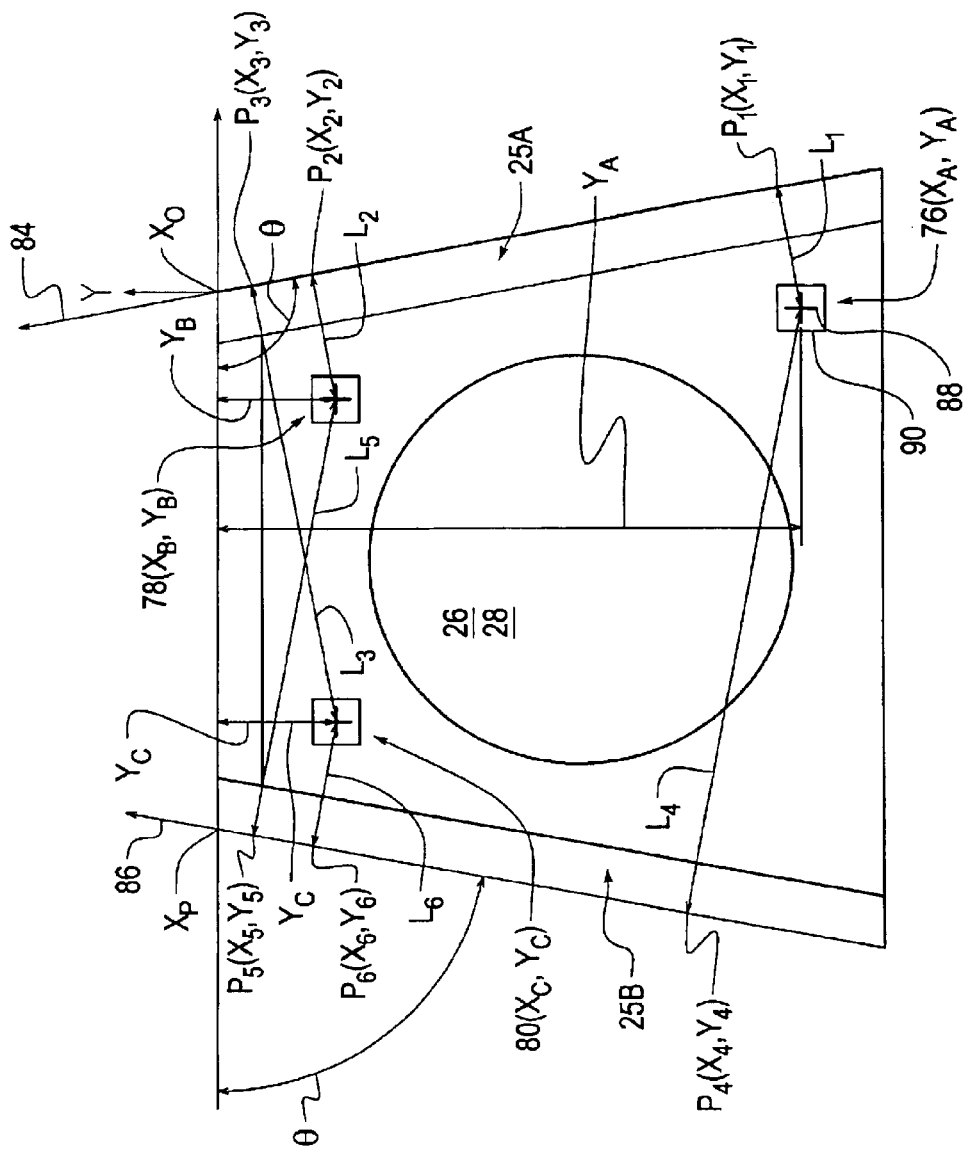
FIG. 5B is a top view of the device table of FIG. 5A with the misalignment of the mirrors exaggerated.
Figure 6A:
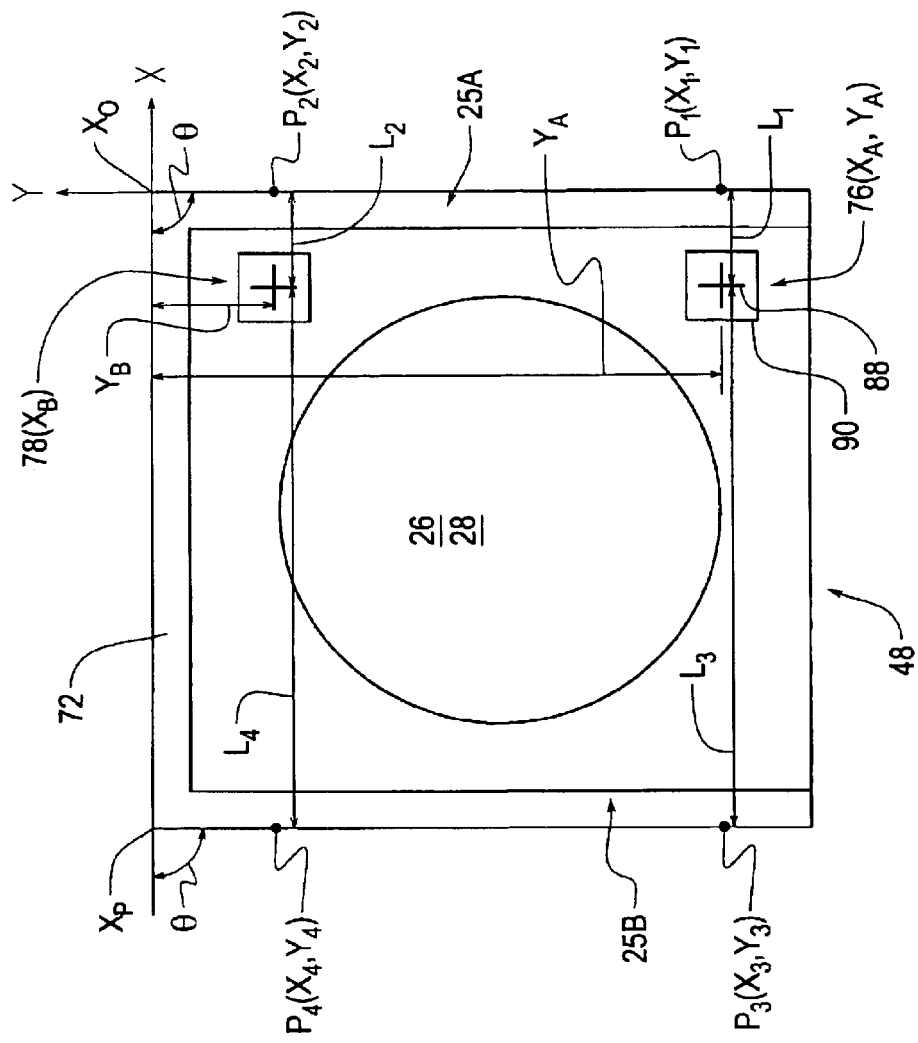
FIG. 6A is a top plan view of a device table that facilitates a discussion of a second system and method having features of the present invention.
Figure 6B:
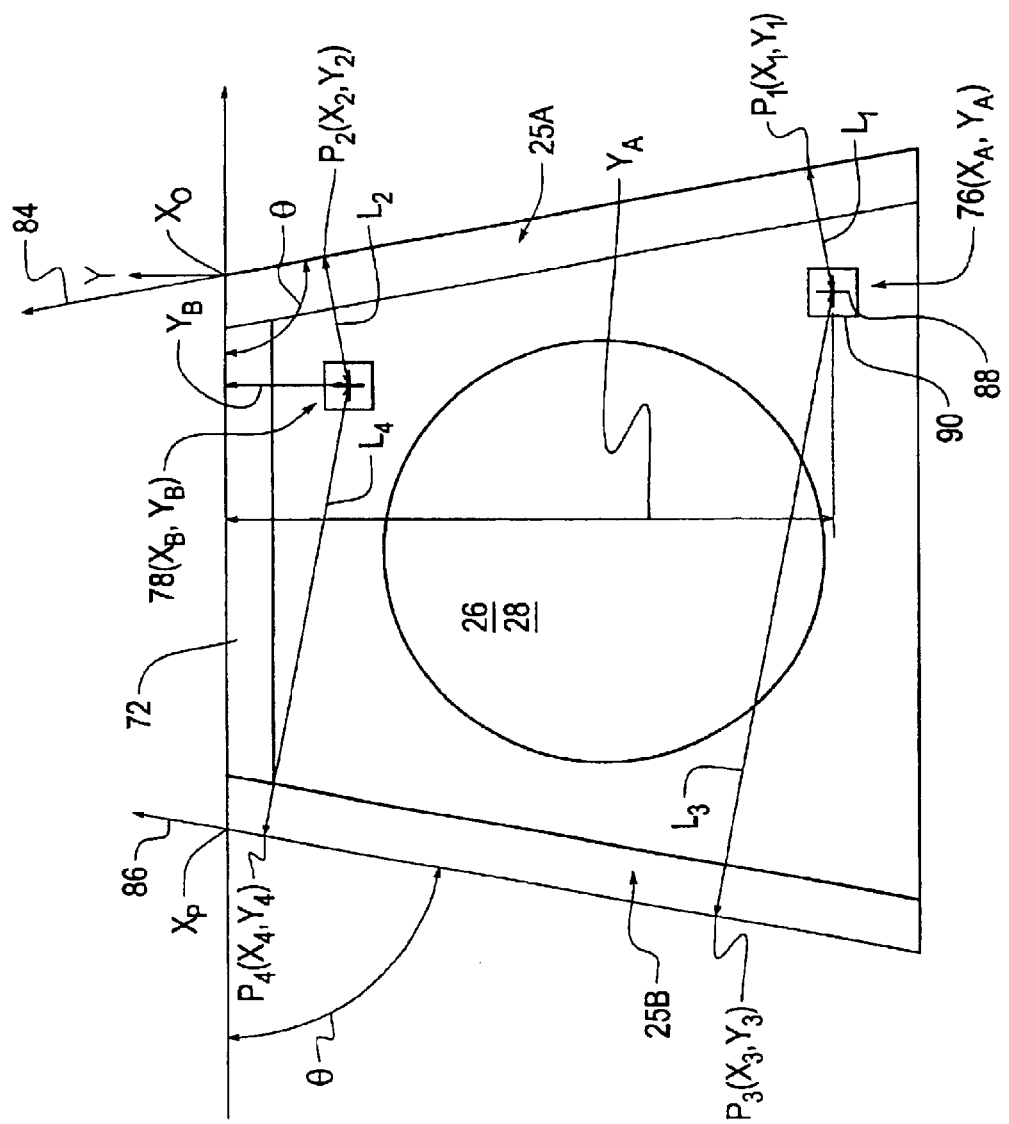
FIG. 6B is a top view of the device table of FIG. 6 with the misalignment of the mirrors exaggerated.

A couple of alternate methods for aligning the mirrors 25A, 25B are provided herein. In particular, FIGS. 5A and 5B illustrate a top plan view of a portion of a stage 14 that facilitates the discussion of a first method for determining the relative positions of the X mirrors 25A, 25B and FIGS. 6A and 6B illustrate a top plan view of a portion of a stage 14 that facilitates the discussion of a second method for determining the relative positions of the X mirrors 25A, 25B. With this information, depending upon the location of the stage 14, the measurement system 20 can use the first X mirror 25A or the second X mirror 25B to monitor the position of each stage 14. This improves the positioning performance of the stage assembly 10. Further, for an exposure apparatus 30, this allows for more accurate positioning of the semiconductor wafer 28 relative to the reticle 32.

In each embodiment illustrated herein, each stage 14 is moved relative to the stage base 12 along the X axis, along the Y axis, and about the Z axis (collectively "the planar degrees of freedom"). More specifically, the stage mover assembly 16 independently moves and positions each of the stages 14 along the X axis, along the Y axis, and about the Z axis under the control of the control system 22. In each embodiment illustrated herein, the stage assembly 10 includes two stages 14 that are independently moved relative to the stage base 12. Alternately, however, each stage assembly 10 could be designed to include only one stage 14 or more than two stages 14.

The stage base 12 supports a portion of the stage assembly 10 above the mounting base 24. The design of the stage base 12 can be varied to suit the design requirements of the stage assembly 10. In the embodiment illustrated in FIGS. 1–4, the stage base 12 is generally rectangular shaped and includes a planar base top 34 (sometimes referred to as a guide face).

In the illustrated embodiments, the stages 14 are maintained above the stage base 12 with a vacuum preload type fluid bearing that allows for motion of each stage 14 along the X axis, along the Y axis, and about the Z axis relative to the stage base 12. Alternately, each of the stages 14 can be supported spaced apart from the stage base 12 in other ways. For example, a magnetic type bearing or a ball bearing type assembly could be utilized that allows for motion of each stage 14 relative to the stage base 12.

Figure 7:
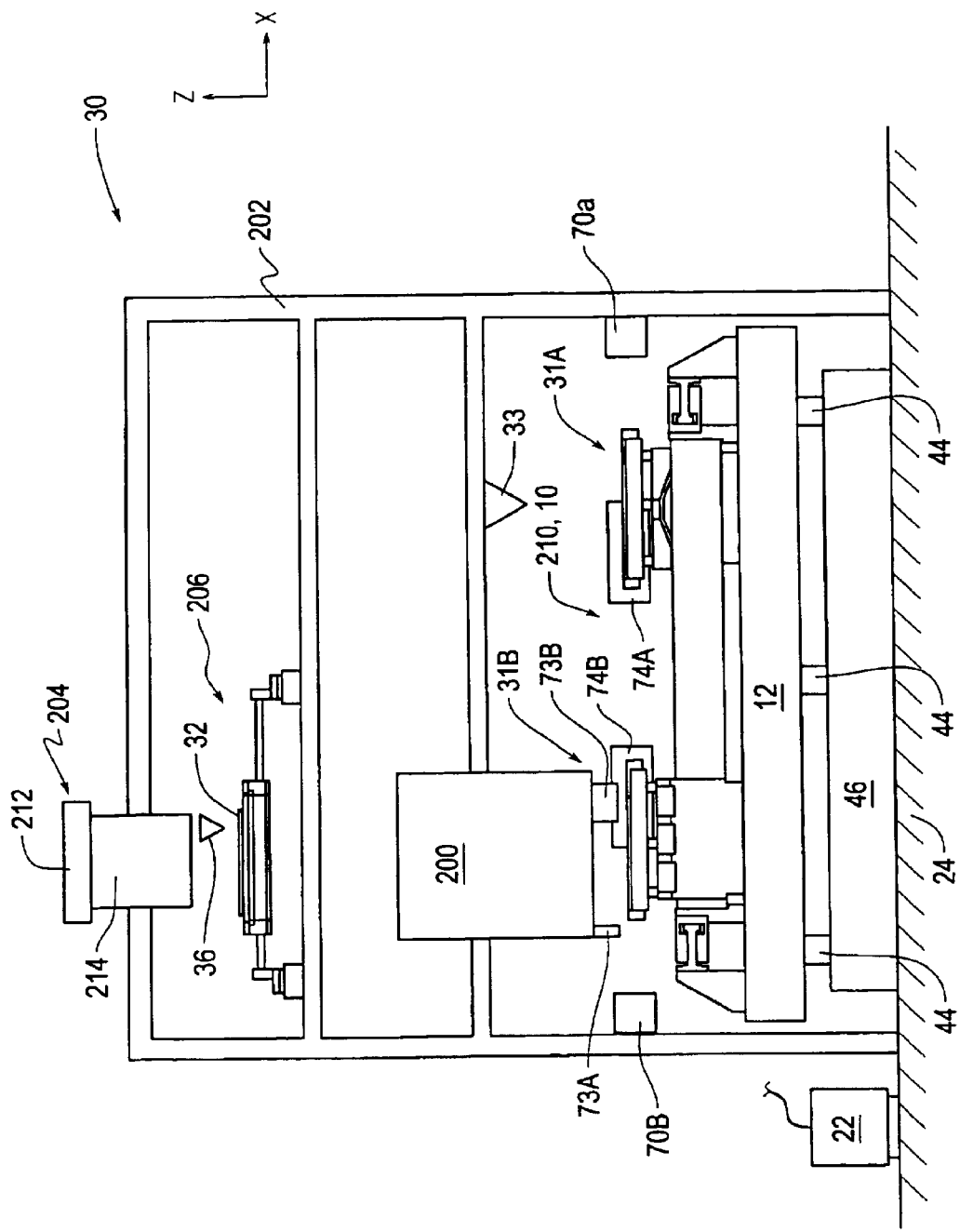
FIG. 7 is a schematic side illustration of an exposure apparatus having features of the present invention.

Preferably, referring to FIG. 7, the stage base 12 is secured with resilient base isolators 44 and a base frame 46 to the mounting base 24. The base isolators 44 reduce the effect of vibration of the base frame 46 causing vibration on the stage base 12. Typically, three spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

Each of the stages 14 retains one device 26. Further, each stage 14 is independently precisely moved by the stage mover assembly 16 to precisely position each device 26. The design of each stage 14 can be varied to suit the design requirements of the stage assembly 10. The design of each stage 14 illustrated in FIGS. 1–4 is substantially the same. Accordingly, the present discussion describes only one of the stages 14. In this embodiment, each stage 14 includes a device table 48, a guide assembly 50, a portion of the stage mover assembly 16, and a portion of the measurement system 20.

The design and movement of the device table 48 for each stage 14 can be varied. In the embodiment illustrated in FIGS. 1–4, the device table 48 moves relative to the guide assembly 50 along the X axis. Further, the device table 48 includes: (i) an upper table component 52, (ii) a lower table component 54 positioned below the upper table component 52, and (iii) a table mover assembly 55 (illustrated in FIG. 3). In this design, the table mover assembly 55 moves the upper table component 52 relative to the lower table component 54.

The upper table component 52 is generally rectangular shaped and includes (i) a first X side 58A, (ii) a second X side 58B that is generally parallel with and spaced apart from the first X side 58A, (iii) a first Y side 58C that is generally perpendicular to the X sides 58A, 58B and (iv) a second Y side 58D that is generally parallel with and spaced apart from the first Y side 58C. The upper table component 52 also includes a device holder (not shown) and a portion of the measurement system 20. The device holder retains the device 26 during movement. The device holder can be a vacuum chuck, an electrostatic chuck, or some other type of clamp.

The lower table component 54 is somewhat rectangular shaped and includes a guide opening (not shown) that is sized and shaped to receive a portion of the guide assembly 50.

The device table 48 is maintained above the stage base 12 and maintained spaced apart from the guide assembly 50 with fluid bearings. The fluid bearing between the device table 48 and the guide assembly 50 allows for motion of the lower table component 54 relative to the guide assembly 50 along the X axis. Further, the fluid bearing inhibits motion of the lower table component 54 relative to the guide assembly 50 along the Y axis and about the Z axis. Alternately, the device table 48 can be supported spaced apart from the stage base 12 and the guide assembly 50 in other ways. For example, a magnetic type bearing (not shown) or a roller bearing type assembly (not shown) could be utilized.

The table mover assembly 55 adjusts the position of the upper table component 52 relative to the lower table component 54 and the stage base 12. The design of the table mover assembly 55 can be varied to suit the design requirements to the stage assembly 10. For example, the table mover assembly 55 can adjust the position of the upper table component 52 and the device holder relative to the lower table component 54 with six degrees of freedom. Alternately, for example, the table mover assembly 55 can be designed to move the upper table component 52 relative to the lower table component 54 with only three degrees of freedom. The table mover assembly 55 can include one or more rotary motors, voice coil motors, linear motors, electromagnetic actuators, or other type of actuators. Still alternately, the upper table component 52 could be fixed to the lower table component 54.

The guide assembly 50 moves the device table 48 along the Y axis and about the Z axis and guides the movement of the device table 48 along the X axis. The design of the guide assembly 50 can be varied to suit the design requirements of the stage assembly 10. In the embodiment illustrated in the Figures, a vacuum preload type, fluid bearing (not shown) maintains the guide assembly 50 spaced apart along the Z axis relative to the stage base 12 and allows for motion of the guide assembly 50 along the Y axis and about the Z axis relative to the stage base 12.

The components of the stage 14 can be made of a number of materials including ceramic, such as alumina or silicon carbide; metals such as aluminum; composite materials; or plastic.

The stage mover assembly 16 controls and moves each of the stages 14 relative to the stage base 12. The design of the stage mover assembly 16 and the movement of each of the stages 14 can be varied to suit the movement requirements of the stage assembly 10. In the embodiment illustrated in FIGS. 1–4, the stage mover assembly 16 moves each of the stages 14 with a relatively large displacement along the X axis, a relatively large displacement along the Y axis, and a limited displacement about the Z axis (theta Z) relative to the stage base 12. In this embodiment, for each of the stages 14, the stage mover assembly 16 includes a left Y stage mover 56A, a right Y stage mover 56B, and an X table mover 60. More specifically, in this embodiment, for each stage 14, (i) the Y stage movers 56A, 56B move the guide assembly 50 with a relatively large displacement along the Y axis and with a limited range of motion about the Z axis (theta Z), and (ii) the X table mover 60 moves the device table 48 with a relatively large displacement along the X axis.

The design of each mover 56A, 56B, 60 can be varied to suit the movement requirements of the stage assembly 10. As provided herein, each of the movers 56A, 56B, 60 can include one or more rotary motors, voice coil motors, linear motors, electromagnetic actuators, or some other force actuators. In the embodiment illustrated in FIGS. 1–4, for each stage 14, each of the movers 56A, 56B, 60 is a linear motor.

The measurement system 20 monitors movement of each stage 14 relative to the optical assembly 200 (illustrated in FIG. 7) or some other reference. With this information, the stage mover assembly 16 can be used to precisely position each of the stages 14. The design of the measurement system 20 can be varied. For example, the measurement system 20 can utilize laser interferometers, encoders, and/or other measuring devices to monitor the position of the stages 14.

In the embodiment illustrated in FIGS. 1–4, the measurement system 20 monitors the position of the device table 48 for each stage 14 along the X axis, along the Y axis, and about the Z axis. For this design, for each stage 14, the measurement system 20 measures the position of the device table 48 along the X axis, along the Y axis, and about the Z axis relative to the optical assembly 200.

In this embodiment, for each stage 14, the measurement system 20 utilizes a linear encoder (not shown) that measures the amount of movement of device table 48 relative to the guide assembly 50 as the device table 48 moves relative to the guide assembly 50. Alternately, for example, an interferometer system (not shown) can be utilized. A suitable interferometer system can be made with components obtained from Agilent Technologies in Palo Alto, Calif.

Additionally, the measurement system 20 includes a first X interferometer 64A, a second X interferometer 64B, and a Y interferometer 66 to monitor the position of the stages 14. The first X interferometer 64A includes the first X mirror 25A and a first X block 70A. The first X block 70A interacts with the first X mirror 25A to monitor the location of each device table 48 along the X axis when the respective device table 48 is near the alignment position 31A. More specifically, the first X block 70A generates a measurement first X laser beam 71A (illustrated in FIGS. 1 and 2) that is reflected off of the first X mirror 25A. With this laser beam 71A, the location of the device table 48 near the alignment position 31A along the X axis can be monitored. Further, because the position of the device table 48 relative to the guide assembly 50 along the X axis is monitored with the encoder, the position of the guide assembly 50 can also be monitored.

The second X interferometer 64B includes a second X mirror 25B and a second X block 70B. The second X block 70B interacts with the second X mirror 25B to monitor the location of each device table 48 along the X axis when the respective device table 48 is near the operational position 31B. More specifically, the second X block 70B generates a measurement second X laser beam 71B (illustrated in FIGS. 1 and 2) that is reflected off of the second X mirror 25B. With this laser beam 71B, the location of the device table 48 along the X axis in the operational position 31B can be monitored. Moreover, the second X block 70B generates another second X laser beam (not shown) that is reflected off of an X reference mirror 73A (illustrated in FIG. 7). The X reference mirror 73A is secured to the optical assembly 200. With this design, measurements from the second X interferometer 64B can be referenced to the optical assembly 200.

Referring to FIGS. 1–4, the first X mirror 25A and the second X mirror 25B are each generally rectangular shaped. For each stage 14, the first X mirror 25A extends along the first X side 58A of the device table 48 and the second X mirror 25B extends along the second X side 58B of the device table 48. The first X mirror 25A and the second X mirror 25B are preferably substantially parallel. The first X block 70A and the second X block 70B are positioned away from the device table 48 on opposite ends of the stage assembly 10. The first X block 70A and the second block 70B can be secured to an apparatus frame 202 (illustrated in FIG. 7) or some other location that is preferably isolated from vibration.

The Y interferometer 66 includes a Y mirror 72, a first Y block 74A, and a second Y block 74B. The Y mirror 72 interacts with the first Y block 74A to monitor the position of one of the device tables 48 along the Y axis and about the Z axis (theta Z) when the device table 48 is in the alignment position 31A. Similarly, the Y mirror 72 interacts with the second Y block 74B to monitor the position of one of the device tables 48 along the Y axis and about the Z axis when the device table 48 is in the operational position 31B. More specifically, the first Y block 74A generates a pair of spaced apart measurement first Y laser beams 75A (illustrated in FIGS. 1 and 2) that are reflected off of the Y mirror 72. With these Y laser beams 75A, the location of the device table 48 along the Y axis and about the Z axis can be monitored in the alignment position 31A Similarly, the second Y block 74B generates a pair of spaced apart measurement second Y laser beams 75B (illustrated in FIGS. 1 and 2) that are reflected off of the Y mirror 72. With the second Y laser beams 75B, the location of the device table 48 along the Y axis and about the Z axis can be monitored in the operational position 31B. Moreover, the second Y block 74B generates a pair of spaced apart additional Y laser beams (not shown) that are reflected off of a Y reference mirror 73B (illustrated in FIG. 7). The Y reference mirror 73B is secured to the optical assembly 200. With this design, measurements from the Y interferometer 66 can be referenced to the optical assembly 200.

Further, because the device table 48 does not move relative to the guide assembly 50 along the Y axis or about the Z axis, the position of the guide assembly 50 along the Y axis and about the X axis can also be monitored by the Y interferometer 66.

In the embodiment illustrated in the Figures, the Y mirror 72 is rectangular shaped and extends along the first Y side 58C of the device table 48 between the first X mirror 25A, and the second X mirror 25B. For each device table 48, the Y mirror 72 is generally perpendicular to the X mirrors 25A, 25B. The Y blocks 74A, 74B are positioned away from the device table 48. The Y blocks 74A, 74B can be secured to the apparatus frame 202 (illustrated in FIG. 7) or some other location that is isolated from vibration.

Additionally, the measurement system 20 can include one or more sensors (not shown) that measure the position of the upper table component 52 relative to the lower table component 54.

The control system 22 receives information from the measurement system 20 and controls the stage mover assembly 16 to precisely position each of the stages 14 and the devices 26. In the embodiment illustrated in FIGS. 1–4, the control system 22 directs and controls the current to each of the Y stage movers 56A, 56B to control movement of the stages 14 along the Y axis and about the Z axis. Similarly, the control system 22 directs and controls current to the X table mover 60 to control movement of the stages 14 along the X axis. Further, the control system 22 directs and controls current to the table mover assembly 55 to precisely position the upper table component 52.

As provided above, the exposure apparatus 30 utilizes the first X interferometer 64A to monitor the position of the respective device table 48 and wafer 28 in the alignment position 31A and the second X interferometer 64B to monitor the position of the respective device table 48 and wafer 28 in the operational position 31B. As a result thereof, the control system 22 must determine how the measurements from the first X interferometer 64A correspond to measurements from the second X interferometer 64B.

As an overview, the control system 22 utilizes the measurement system 20 to monitor the position of the reticle 32 and each device 28 relative to a real coordinate system. The real coordinate system is typically referenced to the optical assembly 200. The first X interferometer 64A takes measurements based upon a X1/Y coordinate system 84 (illustrated in FIGS. 5 and 6). The X1/Y coordinate system 84 includes an X axis that extends along the Y mirror 72 and a Y axis. The second X interferometer 64B utilizes the second X mirror 25B to take measurements based upon a X2/Y coordinate system 86 (illustrated in FIGS. 5 and 6). The X2/Y coordinate system 86 includes an X axis that extends along the Y mirror 72 and a Y axis that originates at the intersection of the second X mirror 25B and the Y mirror 72.

In order to precisely position the stages 14, it is necessary for the control system 22 to convert (i) measurements taken with the first X interferometer 64A based upon the X11/Y coordinate system 84 to the real coordinate system and (ii) measurements taken with the second X interferometer 64B based upon a X2/Y coordinate system 86 to the real coordinate system.

Although the X mirrors 25A, 25B appear to be parallel to each other and the X mirrors 25A, 25B appear to be perpendicular to the Y mirror 72 in FIGS. 5A and 6A, this is not the case. Instead, the X mirrors 25A, 25B are not perfectly parallel to each other and the X mirrors 25A, 25B are not perfectly perpendicular to the Y mirror 72. In FIGS. 5B and 6B, the misalignment of the X mirrors 25A, 25B is exaggerated to facilitate discussion of the present invention. In order for the control system 22 to convert measurements from the first X interferometer 64A and the second X interferometer 64B to the real coordinate system, it is necessary for the control system 22 to first determine the relative alignment of the X mirrors 25A, 25B.

The first method for calibrating the alignment of the first X mirror 25A and the second X mirror 25B can probably be best understood with initial reference to FIGS. 5A and 5B that illustrate a simplified schematic top view of a portion of a device table 48. It should be noted that in FIG. 5B, the misalignment of the X mirrors 25A, 25B is exaggerated. Importantly, in this embodiment, the device table 48 includes a first fiducial mark 76, a second fiducial mark 78, and a third fiducial mark 80. The fiducial marks 76, 78, 80 do not move relative to the mirrors 25A, 25B, 72 and, unlike alignment marks on the wafer, are not covered by photoresist (which can influence measurements). The location, size and shape of each of the fiducial marks 76, 78, 80 can be varied. In the embodiment illustrated in FIGS. 5A and 5B, each of the fiducial marks 76, 78, 80 is a cross hair 88 positioned on a substantially rectangular block 90. Each block 90 is fixedly secured to the upper table component 52 of the device table 48.

The first fiducial mark 76 is positioned near the first X mirror 25A beyond the outer circumference of the device 26 and away from the Y mirror 72. The second fiducial mark 78 is positioned near the first X mirror 25A and the Y mirror 72, beyond the outer circumference of the device 26 and between the Y mirror 72 and the first fiducial mark 76. The third fiducial mark 80 is positioned near the second X mirror 25B and the Y mirror 72, beyond the outer circumference of the device 26.

In the first method for calculating the relative positions of the X mirrors 25A, 25B, it is assumed that (i) the X mirrors 25A, 25B are straight, (ii) the Y axis of the real coordinate system is perpendicular to X axis, and (iii) the Y axis of both the real coordinate system and the X1/Y coordinate system 84 originates at the intersection of the first X mirror 25A and the Y mirror 72.

The following symbols are used in conjunction with FIGS. 5A and 5B and the discussion provided below to describe the first method for calculating the alignment of the X mirrors 25A, 25B. A number of the components discussed below are not illustrated in FIG. 5.

$P_1$ is the point on the first X mirror 25A that the first X laser beam 71A from the first X block 70A hits when the cross hair 88 of the first fiducial mark 76 is aligned under the cross hair (not shown) visible in the alignment device 33.

$P_2$ is the point on the first X mirror 25A that the first X laser beam 71A from the first X block 70A hits when the cross hair 88 of the second fiducial mark 78 is aligned under the cross hair visible in the alignment device 33.

$P_3$ is the point on the first X mirror 25A that the first X laser beam 71A from the first X block 70A hits when the cross hair 88 of the third fiducial mark 80 is aligned under the cross hair visible in the alignment device 33.

$P_4$ is the point on the second X mirror 25B that the second X laser beam 71B from the second X block 70B hits when the cross hair 88 of the first fiducial mark 76 is aligned under the cross hair (not shown) visible in the projection device 36.

$P_5$ is the point on the second X mirror 25B that the second X laser beam 71B from the second X block 70B hits when the cross hair 88 of the second fiducial mark 78 is aligned under the cross hair visible in the projection device 36.

$P_6$ is the point on the second X mirror 25B that the second X laser beam 71B from the second X block 70B hits when the cross hair 88 of the third fiducial mark 80 is aligned under the cross hair visible in the projection device 36.

$X_0$ represents where both the real coordinate system and the X1/Y coordinate system 84 originates. $X_0$ is at the intersection of the first X mirror 25A and the Y mirror 72. $X_0$ is defined as zero in the first method.

The following terms are measured with the interferometers 64A, 64B, 66 and are considered known:

$L_1$ is the distance between $P_1$ on the first X mirror 25A and the cross hair 88 of the first fiducial mark 76. $L_1$ is determined by measuring with the first X interferometer 64A the amount of movement of the first X mirror 25A during movement of the device table 48 from a zero position (not shown) to when the cross hair 88 of the first fiducial mark 76 is aligned under the cross hair visible in the alignment device 33. The zero position is an arbitrary position that is established when the interferometers 64A, 64B, 66 are initially started.

$L_2$ is the distance between $P_2$ on the first X mirror 25A and the cross hair 88 of the second fiducial mark 78. $L_2$ is determined by measuring with the first X interferometer 64A the amount of movement of the first X mirror 25A during movement of the device table 48 from the zero position to when the cross hair 88 of the second fiducial mark 78 is aligned under the cross hair visible in the alignment device 33.

$L_3$ is the distance between $P_3$ on the first X mirror 25A and the cross hair 88 of the third fiducial mark 80. $L_3$ is determined by measuring with the first X interferometer 64A the amount of movement of the first X mirror 25A during movement of the device table 48 from the zero position to when the cross hair 88 of the third fiducial mark 80 is aligned under the cross hair visible in the alignment device 33.

$L_4$ is the distance between $P_4$ on the second X mirror 25B and the cross hair 88 of the first fiducial mark 76. $L_4$ is determined by measuring with the second X interferometer 64B the amount of movement of the second X mirror 25B during movement of the device table 48 from the zero position to when the cross hair 88 of the first fiducial mark 76 is aligned under the cross hair visible in the projection device 36.

$L_5$ is the distance between $P_5$ on the second X mirror 25B and the cross hair 88 of the second fiducial mark 78. $L_5$ is determined by measuring with the second X interferometer 64B the amount of movement of the second X mirror 25B during movement of the device table 48 from the zero position to when the cross hair 88 of the second fiducial mark 78 is aligned under the cross hair visible in the projection device 36.

$L_6$ is the distance between $P_6$ on the second X mirror 25B and the cross hair 88 of the third fiducial mark 80. $L_6$ is determined by measuring with the second X interferometer 64B the amount of movement of the second X mirror 25B during movement of the device table 48 from the zero position to when the cross hair 88 of the third fiducial mark 80 is aligned under the cross hair visible in the projection device 36.

$Y_A$ is the distance between the Y mirror 72 and the cross hair 88 of the first fiducial mark 76. $Y_A$ is determined by measuring with the Y interferometer 66 the amount of movement of the Y mirror 72 during movement of the device table 48 from the zero position to when the cross hair 88 of the first fiducial mark 76 is aligned under the cross hair visible in the alignment device 33.

$Y_B$ is the measured distance between the Y mirror 72 and the cross hair 88 of the second fiducial mark 78. $Y_B$ is determined by measuring with the Y interferometer 66 the amount of movement of the Y mirror 72 during movement of the device table 48 from the zero position to when the cross hair 88 of the second fiducial mark 78 is aligned under the cross hair visible in the alignment device 33.

$Y_C$ is the measured distance between the Y mirror 72 and the cross hair 88 of the third fiducial mark 80. $Y_C$ is determined by measuring with the Y interferometer 66 the amount of movement of the Y mirror 72 during movement of the device table 48 from the zero position to when the cross hair 88 of the third fiducial mark 80 is aligned under the cross hair visible in the alignment device 33.

The following terms are unknown and are calculated by the control system 22 utilizing the methods provided herein:

$X_1$ represents the X coordinate position of $P_1$ on the real coordinate system.

$X_2$ represents the X coordinate position of $P_2$ on the real coordinate system.

$X_3$ represents the X coordinate position of $P_3$ on the real coordinate system.

$X_4$ represents the X coordinate position of $P_4$ on the real coordinate system.

$X_5$ represents the X coordinate position of $P_5$ on the real coordinate system.

$X_6$ represents the X coordinate position of $P_6$ on the real coordinate system.

$Y_1$ represents the Y coordinate position of $P_1$ on the real coordinate system.

$Y_2$ represents the Y coordinate position of $P_2$ on the real coordinate system.

$Y_3$ represents the Y coordinate position of $P_3$ on the real coordinate system.

$Y_4$ represents the Y coordinate position of $P_4$ on the real coordinate system.

$Y_5$ represents the Y coordinate position of $P_5$ on the real coordinate system.

$Y_6$ represents the Y coordinate position of $P_6$ on the real coordinate system.

$X_A$ represents the X coordinate position of the first fiducial mark 76 on the real coordinate system.

$X_B$ represents the X coordinate position of the second fiducial mark 78 on the real coordinate system.

$X_C$ represents the X coordinate position of the third fiducial mark 80 on the real coordinate system.

$\theta$ represents the angle between the first X mirror 25A and the Y mirror 72.

$\phi$ represents the angle between the second X mirror 25B and the Y mirror 72.

$X_P$ represents the X coordinate position of the second X mirror 25B in the real coordinate system. Stated another way, $X_P$ represents the distance between (i) the intersection of the first X mirror 25A and the Y mirror 72 and (ii) the intersection of the second X mirror 25B and the Y mirror 72.

There are ten know values and eighteen unknown values. These unknown values can be determined by the control system 22 by solving the following eighteen equations.

The following three equations define the distance from (i) the first X mirror 25A to the first fiducial mark 76, (ii) the second fiducial mark 78, and (iii) the third fiducial mark 80 respectively:

$$(X_1-X_A)^2+(Y_1-Y_A)^2=L_1^2$$

$$(X_2-X_B)^2+(Y_2-Y_B)^2=L_2^2$$

$$(X_3-X_C)^2+(Y_3-Y_C)^2=L_3^2$$

The following three equations define the distance from the second X mirror 25B to (i) the first fiducial mark 76, (ii) the second fiducial mark 78, and (iii) the third fiducial mark 80 respectively:

$$(X_4-X_A)^2+(Y_4-Y_A)^2=L_4^2$$

$$(X_5-X_B)^2+(Y_5-Y_B)^2=L_5^2$$

$$(X_6-X_C)^2+(Y_6-Y_C)^2=L_6^2$$

The following six equations relate to the angle $\theta$ of the first X mirror 25A relative to the Y mirror 72:

$$\frac{Y_1}{X_0-X_1}=\tan\theta \quad \frac{X_A-X_1}{Y_A-Y_1}=\tan\theta$$

$$\frac{Y_2}{X_0-X_2}=\tan\theta \quad \frac{X_B-X_2}{Y_B-Y_2}=\tan\theta$$

$$\frac{Y_3}{X_0-X_3}=\tan\theta \quad \frac{X_C-X_3}{Y_C-Y_3}=\tan\theta$$

The following six equations relate to the angle $\phi$ of the second X mirror 25B relative to the Y mirror 72:

$$\frac{Y_4}{X_P-X_4}=\tan\phi \quad \frac{X_4-X_A}{Y_4-Y_A}=\tan\phi$$

$$\frac{Y_5}{X_P-X_5}=\tan\phi \quad \frac{X_5-X_B}{Y_5-Y_B}=\tan\phi$$

$$\frac{Y_6}{X_P-X_6}=\tan\phi \quad \frac{X_6-X_C}{Y_6-Y_C}=\tan\phi$$

The control system 22 solves these 18 equations to determine the values of 18 unknowns. Once the angles $\theta$ and φ are determined, the relative position of the X mirrors 25A, 25B are known. Further, the control system 22 can convert measurements from the first X interferometer 64A and the second X interferometer 64B to the real coordinate system. More importantly, the control system 22 can determine the position of every alignment mark on the wafer 28 measured with the first X interferometer 64A and the Y interferometer 66 relative to the real coordinate system.

As provided above, each of the wafers 28 includes a plurality of chip alignment marks (not shown) that identify the location of the chips (not shown) on the wafers 28. In the alignment position 31A, the wafer 28 is positioned on the respective stage 14. Subsequently, in the alignment position 31A, the alignment device 33 is used in conjunction with the first X interferometer 64A and the Y interferometer 66 (i) to determine the position in X1/Y coordinate system 84 of the wafer alignment marks of the wafer 28 relative to the first fiduciary mark 76, and (ii) to measure the values of $L_1$, $L_2$, $L_3$, $Y_a$, $Y_b$ and $Y_c$. In the operational position 31B, the projection device 36 is used in conjunction with the second X interferometer system 64B and the Y interferometer 66 to determine the position of the first fiduciary mark 76 relative to the reticle 32 and relative to optical assembly 200. Further, the second X interferometer system 64B and the Y interferometer 66 are used to measure the values for $L_4$, $L_5$, $L_6$. With this information, the control system determines the relative positions of the X mirrors 25A, 25B. Further, the control system 22 is able to accurately determine the positions of the wafer alignment marks relative to the reticle 32 and the optical assembly 200.

The second method for calibrating the alignment of the first X mirror 25A and the second X mirror 25B can probably be best understood with initial reference to FIGS. 6A and 6B that illustrate a simplified schematic top view of a portion of a device table 48. It should be noted that in FIG. 6B, the misalignment of the X mirrors 25A, 25B is exaggerated. In this embodiment, the device table 48 includes only the first fiducial mark 76, and a second fiducial mark 78. The fiducial marks 76, 78 do not move relative to the mirrors 25A, 25B, 72 and, unlike alignment marks on the wafer, are not covered by photoresist (which can affect measurements). The location, size and shape of each of the fiducial marks 76, 78, can be varied. In the embodiment illustrated in FIGS. 6A and 6B, each of the fiducial marks 76, 78 is a cross hair 88 positioned on a substantially rectangular block 90. Each block 90 is fixedly secured to the device table 48.

The first fiducial mark 76 is positioned near the first X mirror 25A beyond the outer circumference of the device 26 and away from the Y mirror 72. The second fiducial mark 78 is positioned near the first X mirror 25A and the Y mirror 72, beyond the outer circumference of the device 26 and between the Y mirror 72 and the first fiducial mark 76.

In the second method for calculating the relative positions of the X mirrors 25A, 25B, it is assumed that (i) the X mirrors 25A, 25B are straight, and (ii) the first fiducial mark 76 and the second fiducial mark 78 are attached to the device table 48 along a line that is perpendicular to the Y mirror 72. Stated another way, the first fiducial mark 76 and the second fiducial mark 78 are assumed to lie on the Y axis of the real coordinate system.

The following symbols are used in conjunction with FIG. 6 and the discussion provided below to describe the second method for calculating the alignment of the X mirrors 25A, 25B. A number of the components discussed below are not illustrated in FIG. 6.

$P_1$ is the point on the first X mirror 25A that the first X laser beam 71A from the first X block 70A hits when the cross hair 88 of the first fiducial mark 76 is aligned under the cross hair (not shown) visible in the alignment device 33.

$P_2$ is the point on the first X mirror 25A that the first X laser beam 71A from the first X block 70A hits when the cross hair 88 of the second fiducial mark 78 is aligned under the cross hair visible in the alignment device 33.

$P_3$ is the point on the second X mirror 25B that the second X laser beam 71B from the second X block 70B hits when the cross hair 88 of the first fiducial mark 76 is aligned under the cross hair (not shown) visible in the projection device 36.

$P_4$ is the point on the second X mirror 25B that the second X laser beam 71B from the second X block 70B hits when the cross hair 88 of the second fiducial mark 78 is aligned under the cross hair visible in the projection device 36.

The following terms are measured with the interferometers 64A, 64B, 66 and are considered known:

$L_1$ is the distance between $P_1$ on the first X mirror 25A and the cross hair 88 of the first fiducial mark 76. $L_1$ is determined by measuring with the first X interferometer 64A the amount of movement of the first X mirror 25A during movement of the device table 48 from a zero position (not shown) to when the cross hair 88 of the first fiducial mark 76 is aligned under the cross hair visible in the alignment device 33.

$L_2$ is the distance between $P_2$ on the first X mirror 25A and the cross hair 88 of the second fiducial mark 78. $L_2$ is determined by measuring with the first X interferometer 64A the amount of movement of the first X mirror 25A during movement of the device table 48 from the zero position to when the cross hair 88 of the second fiducial mark 78 is aligned under the cross hair visible in the alignment device 33.

$L_3$ is the distance between $P_3$ on the second X mirror 25B and the cross hair 88 of the first fiducial mark 76. $L_3$ is determined by measuring with the second X interferometer 64B the amount of movement of the second X mirror 25B during movement of the device table 48 from the zero position to when the cross hair 88 of the first fiducial mark 76 is aligned under the cross hair visible in the projection device 36.

$L_4$ is the distance between $P_4$ on the second X mirror 25B and the cross hair 88 of the second fiducial mark 78. $L_4$ is determined by measuring with the second X interferometer 64B the amount of movement of the second X mirror 25B during movement of the device table 48 from the zero position to when the cross hair 88 of the second fiducial mark 78 is aligned under the cross hair visible in the projection device 36.

$Y_A$ is the distance between the Y mirror and the cross hair 88 of the first fiducial mark. $Y_A$ is determined by measuring with the Y interferometer 66 the amount of movement of the Y mirror 72 during movement of the device table 48 from the zero position to when the cross hair 88 of the first fiducial mark 76 is aligned under the cross hair visible in the alignment device 33.

$Y_B$ is the measured distance between the Y mirror and the cross hair 88 of the second fiducial mark. $Y_B$ is determined by measuring with the Y interferometer 66 the amount of movement of the Y mirror 72 during movement of the device table 48 from the zero position to when the cross hair 88 of the second fiducial mark 78 is aligned under the cross hair visible in the alignment device 33.

$X_A$ represents the X coordinate position of the first fiducial mark 76 on the real coordinate system. $X_A$ is defined as zero.

$X_B$ represents the X coordinate position of the second fiducial mark 78 on the real coordinate system. $X_B$ is defined as zero.

The following terms are unknown and are calculated by the control system 22 utilizing the methods provided herein:

$X_1$ represents the X coordinate position of $P_1$ on the real coordinate system.

$X_2$ represents the X coordinate position of $P_2$ on the real coordinate system.

$X_3$ represents the X coordinate position of $P_3$ on the real coordinate system.

$X_4$ represents the X coordinate position of $P_4$ on the real coordinate system.

$Y_1$ represents the Y coordinate position of $P_1$ on the real coordinate system.

$Y_2$ represents the Y coordinate position of $P_2$ on the real coordinate system.

$Y_3$ represents the Y coordinate position of $P_3$ on the real coordinate system.

$Y_4$ represents the Y coordinate position of $P_4$ on the real coordinate system.

$\theta$ represents the angle between the first X mirror 25A and the Y mirror 72.

$\phi$ represents the angle between the second X mirror 25B and the Y mirror 72.

$X_P$ represents the X coordinate position of the second X mirror 25B in the real coordinate system.

$X_0$ represents the X coordinate position of the intersection of the first X mirror 25A and the Y mirror 72 on the real coordinate system.

In this method, there are eight know values and twelve unknown values. These unknown values can be determined utilizing the following twelve equations.

The following two equations define the distance from the first X mirror 25A to (i) the first fiducial mark 76, and (ii) the second fiducial mark 78 respectively:

$$(X_1-X_A)^2+(Y_1-Y_A)^2=L_1^2$$

$$(X_2-X_B)^2+(Y_2-Y_B)^2=L_2^2$$

The following two equations define the distance from the second X mirror 25B to (i) the first fiducial mark 76 and (ii) the second fiducial mark 78 respectively:

$$(X_3-X_A)^2+(Y_3-Y_A)^2=L_3^2$$

$$(X_4-X_B)^2+(Y_4-Y_B)^2=L_4^2$$

The following four equations relate to the angle $\theta$ of the first X mirror 25A relative to the Y mirror 72:

$$\frac{Y_1}{X_0-X_1}=\tan\theta \quad \frac{X_A-X_1}{Y_A-Y_1}=\tan\theta$$

$$\frac{Y_2}{X_0-X_2}=\tan\theta \quad \frac{X_B-X_2}{Y_B-Y_2}=\tan\theta$$

The following four equations relate to the angle $\phi$ of the second X mirror 25B relative to the Y mirror 72:

$$\frac{Y_3}{X_P-X_3}=\tan\phi \quad \frac{X_A-X_3}{Y_A-Y_3}=\tan\phi$$

$$\frac{Y_4}{X_P-X_4}=\tan\phi \quad \frac{X_B-X_4}{Y_B-Y_4}=\tan\phi$$

The control system 22 solves these 12 equations to determine the values of the 12 unknowns. Once the angles $\theta$ and $\phi$ are determined, the relative position of the X mirrors 25A, 25B are known. Further, the control system 22 can convert measurements from the first X interferometer 64A and the second X interferometer 64B to the real coordinate system. More importantly, the control system 22 can determine the position of every alignment mark on the wafer 28 measured with the first X interferometer 64A and the Y interferometer 66 relative to the real coordinate system.

As provided above, each of the wafers 28 includes a plurality of chip alignment marks (not shown) that identify the location of the chips (not shown) on the wafers 28. In the alignment position 31A, the wafer 28 is positioned on the respective stage 14. Subsequently, in the alignment position 31A, the alignment device 33 is used in conjunction with the first X interferometer 64A and the Y interferometer 66 (i) to determine the position of the wafer alignment marks of the wafer 28 relative to the first fiduciary mark 76, and (ii) to measure the values of $L_1$, $L_2$, $Y_a$, and $Y_b$. In the operational position 31B, the projection device 36 is used in conjunction with the second X interferometer system 64B and the Y interferometer 66 to determine the position of the first fiduciary mark 76 relative to the reticle 32 and relative to optical assembly 200. Further, the second X interferometer system 64B and the Y interferometer 66 are used to measure the values for $L_3$ and $L_4$. With this information, the control system determines the relative positions of the X mirrors 25A, 25B. Further, the control system 22 is able to determine the positions of the wafer alignment marks relative to the reticle 32 and the optical assembly 200.

FIG. 7 is a schematic view illustrating an exposure apparatus 30 useful with the present invention. The exposure apparatus 30 includes the apparatus frame 202, an illumination system 204 (irradiation apparatus), a reticle stage assembly 206, the optical assembly 200 (lens assembly), and a wafer stage assembly 210. The stage assemblies 10 provided herein can be used as the wafer stage assembly 210. Alternately, with the disclosure provided herein, the stage assemblies 10 provided herein can be modified for use as the reticle stage assembly 206.

The exposure apparatus 30 is particularly useful as a lithographic device that transfers a pattern (not shown) of an integrated circuit from the reticle 32 onto the semiconductor wafer 28. The exposure apparatus 30 mounts to the mounting base 24, e.g., the ground, a base, or floor or some other supporting structure.

The apparatus frame 202 is rigid and supports the components of the exposure apparatus 30. The design of the apparatus frame 202 can be varied to suit the design requirements for the rest of the exposure apparatus 30. The apparatus frame 202 illustrated in FIG. 7 supports the optical assembly 200 and the illumination system 204 and the reticle stage assembly 206 above the mounting base 24.

The illumination system 200 includes an illumination source 212 and an illumination optical assembly 214. The illumination source 212 emits a beam (irradiation) of light energy. The illumination optical assembly 214 guides the beam of light energy from the illumination source 212 to the optical assembly 200. The beam illuminates selectively different portions of the reticle 32 and exposes the semiconductor wafer 28. In FIG. 7, the illumination source 212 is illustrated as being supported above the reticle stage assembly 206. Typically, however, the illumination source 212 is secured to one of the sides of the apparatus frame 202 and the energy beam from the illumination source 212 is directed to above the reticle stage assembly 206 with the illumination optical assembly 214.

The optical assembly 200 projects and/or focuses the light passing through the reticle to the wafer. Depending upon the design of the exposure apparatus 30, the optical assembly 200 can magnify or reduce the image illuminated on the reticle.

The reticle stage assembly 206 holds and positions the reticle relative to the optical assembly 200 and the wafer. Similarly, the wafer stage assembly 210 holds and positions the wafers with respect to the projected image of the illuminated portions of the reticle in the operational area. In FIG. 7, the wafer stage assembly 210 utilizes a stage assembly 10 having features of the present invention. Depending upon the design, the exposure apparatus 30 can also include additional motors to move the stage assemblies 206, 210.

There are a number of different types of lithographic devices. For example, the exposure apparatus 30 can be used as scanning type photolithography system that exposes the pattern from the reticle onto the wafer with the reticle and the wafer moving synchronously. In a scanning type lithographic device, the reticle is moved perpendicular to an optical axis of the optical assembly 200 by the reticle stage assembly 206 and the wafer is moved perpendicular to an optical axis of the optical assembly 200 by the wafer stage assembly 210. Scanning of the reticle and the wafer occurs while the reticle and the wafer are moving synchronously.

Alternately, the exposure apparatus 30 can be a step-and-repeat type photolithography system that exposes the reticle while the reticle and the wafer are stationary. In the step and repeat process, the wafer is in a constant position relative to the reticle and the optical assembly 200 during the exposure of an individual field. Subsequently, between consecutive exposure steps, the wafer is consecutively moved by the wafer stage perpendicular to the optical axis of the optical assembly 200 so that the next field of the wafer is brought into position relative to the optical assembly 200 and the reticle for exposure. Following this process, the images on the reticle are sequentially exposed onto the fields of the wafer so that the next field of the wafer is brought into position relative to the optical assembly 200 and the reticle.

However, the use of the exposure apparatus 30 and the stage assembly 10 provided herein are not limited to a photolithography system for semiconductor manufacturing. The exposure apparatus 30, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The illumination source 212 can be g-line (436 nm), i-line (365 nm), KrF excimer laser (248 nm), ArF excimer laser (193 nm) and $F_2$ laser (157 nm). Alternately, the illumination source 212 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 200 included in the photolithography system, the optical assembly 200 need not be limited to a reduction system. It could also be a 1× or magnification system.

With respect to an optical assembly 200, when far ultra-violet rays such as the excimer laser is used, glass materials such as quartz and fluorite that transmit far ultra-violet rays is preferable to be used. When the $F_2$ type laser or x-ray is used, the optical assembly 200 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 8:
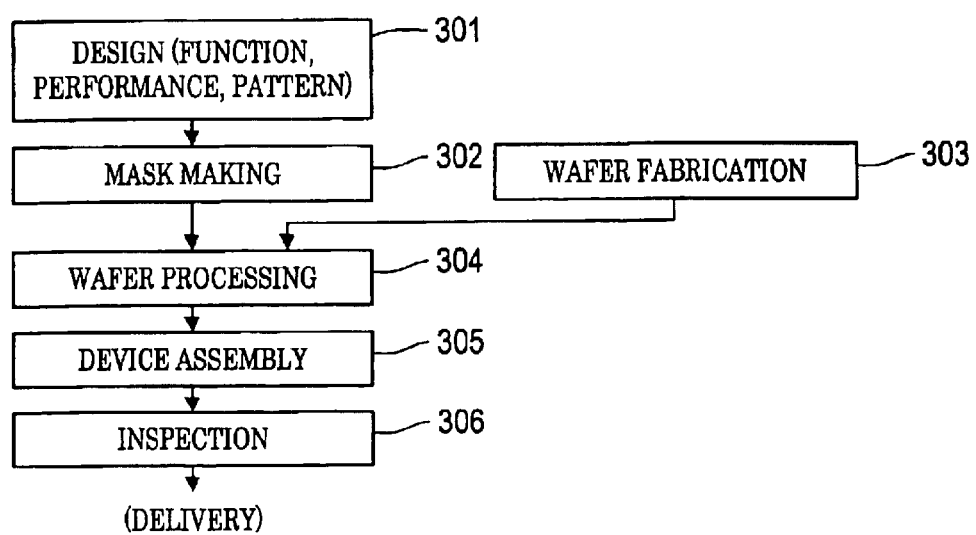
FIG. 8 is a flow chart that outlines a process for manufacturing a device in accordance with the present invention.

Further, semiconductor devices can be fabricated using the above described systems, by the process shown generally in FIG. 8. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 9:
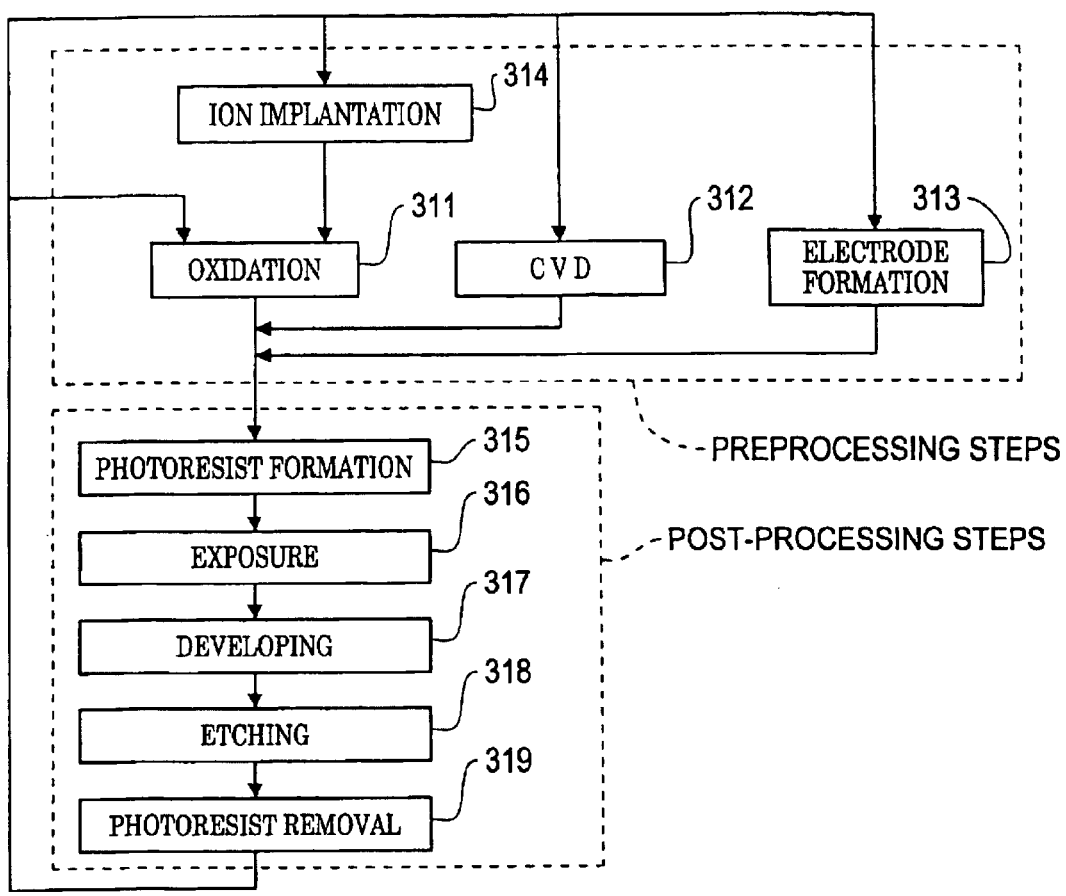
FIG. 9 is a flow chart that outlines device processing in more detail.

FIG. 9 illustrates a detailed flowchart example of the above-mentioned step 304 in the case of fabricating semiconductor devices. In FIG. 9, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device, the stage assembly comprising:
   a device table that retains the device;
   a stage mover assembly connected to the device table, the stage mover assembly moves the device table in a first direction and in a second direction different from the first direction;
   a measurement system for monitoring the position of the device table, the measurement system including a first X mirror and a second X mirror that are secured to the device table;
   a plurality of fiducial marks that are secured to the device table, two fiducial marks of the plurality of fiducial marks have positions that are different from each other both in the first direction and in the second direction; and
   a control system that utilizes the plurality of fiducial marks to determine the position of the first X mirror relative to the second X mirror.

2. The stage assembly of claim 1 wherein the measurement system measures (i) the position of a first fiducial mark relative to the first X mirror and the second X mirror, and (ii) the position of a second fiducial mark relative to the first X mirror and the second X mirror.

3. The stage assembly of claim 2 wherein the control system utilizes the measured position of the first fiducial mark relative to the first X mirror and the second X mirror, and the measured position of the second fiducial mark relative to the first X mirror and the second X mirror to determine the position of the first X mirror relative to the second X mirror.

4. The stage assembly of wherein the control system utilizes a first fiducial mark, a second fiducial mark and third fiducial mark of the plurality of fiducial marks to determine the position of the first X mirror relative to the second X mirror.

5. The stage assembly of claim 4 wherein the measurement system measures (i) the position of the first fiducial mark relative to the first X mirror and the second X mirror, (ii) the position of the second fiducial mark relative to the first X mirror and the second X mirror, and (iii) the position of the third fiducial mark relative to the first X mirror and the second X mirror.

6. The stage assembly of claim 5 wherein the control system utilizes (i) the measured position of the first fiducial mark relative to the first X mirror and the second X mirror, (ii) the measured position of the second fiducial mark relative to the first X mirror and the second X mirror, and (iii) the measured position of the third fiducial mark relative to the first X mirror and the second X mirror to determine the position of the first X mirror relative to the second X mirror.

7. The stage assembly of claim 1 wherein the measurement system includes a first X block that interacts with the first X mirror to monitor the position of the device table.

8. The stage assembly of claim 7 wherein the first X block interacts with the first X mirror to monitor the position of the device table when the device table is in an alignment position.

9. The stage assembly of claim 8 wherein the measurement system includes a second X block that interacts with the second X mirror to monitor the position of the device table.

10. The stage assembly of claim 9 wherein the second X block interacts with the second X mirror to monitor the position of the device table when the device table is in an operational position.

11. An exposure apparatus comprising:
a first movable stage that moves in a first direction and a second direction different from the first direction, the first movable stage holding a first substrate and having a first reflective portion extending in the first direction, a second reflective portion parallel to the first reflective portion, and a first mark portion having a plurality of fiducial marks, two fiducial marks of the plurality of fiducial marks have positions that are different from each other both in the first direction and in the second direction;
a first position detector that detects a position of the first movable stage cooperating with the first reflective portion;
a first mark detector that detects the plurality of fiducial marks when the first position detector detects the position of the first movable stage;
a second position detector that detects a position of the first movable stage cooperating with the second reflective portion;
a second mark detector that detects the plurality of fiducial marks when the second position detector detects the position of the first movable stage;
a projection system that projects a pattern onto the first substrate; and
a controller that communicates with the first position detector, the second position detector, the first mark detector, and the second mark detector to correlate the first reflective portion with the second reflective portion.

12. The exposure apparatus of claim 11, wherein the first position detector and the second position detector comprise an interferometer system.

13. The exposure apparatus of claim 11, wherein the first movable stage has a third reflective portion extending in the second direction.

14. The exposure apparatus of claim 11, wherein the first movable stage is a cantilevered stage.

15. The exposure apparatus of claim 11, wherein each of the plurality of fiducial marks of the first mark portion comprises a two dimensional mark.

16. The exposure apparatus of claim 11, further comprising a second movable stage that moves in the first direction and the second direction, the second movable stage holding a second substrate and having a fourth reflective portion extending in the first direction, a fifth reflective portion parallel to the fourth reflective portion, and a second mark portion having a plurality of fiducial marks.

17. The exposure apparatus of claim 16, wherein the controller correlates the fourth reflective portion with the fifth reflective portion.

18. The exposure apparatus of claim 16, wherein the second movable stage has a sixth reflective portion extending in the second direction.

19. The exposure apparatus of claim 16, wherein the second movable stage is a cantilevered stage.

20. The exposure apparatus of claim 16, wherein each of the plurality of fiducial of the second mark portion comprises a two dimensional mark.

21. The exposure apparatus of claim 16, further comprising a replacer that replaces the first and second movable stages with respect to the first and second position detectors.

22. The exposure apparatus of claim 21, wherein the first mark detector detects the second mark portion when the first position detector detects a position of the second moveable stage cooperating with the fourth reflective portion.

23. The exposure apparatus of claim 21, wherein the second mark detector detects the second mark portion when the second position detector detects a position of the second movable stage cooperating with the fifth reflective portion.

24. A method for determining the relative positions of a first X mirror and a second X mirror that are secured to a device table, the method comprising the steps of:
securing a plurality of fiducial marks to the device table, two fiducial marks of the plurality of fiducial marks have positions that are different from each other both in a first direction and in a second direction, the second direction is different from the first direction; and
determining the position of the first X mirror relative to the second X mirror using the plurality of fiducial marks.

25. The method of claim 24 including the step of providing a first X block that interacts with the first X mirror to monitor the position of the device table in an alignment position.

26. The method of claim 25 including the step of providing a second X block that interacts with the second X mirror to monitor the position of the device table in an operational position.

27. The method of claim 24 wherein the step of determining the position includes the step of measuring (i) the position of a first fiducial mark relative to the first X mirror and the second X mirror, and (ii) the position of a second fiducial mark relative to the first X mirror and the second X mirror.

28. The method of claim 27 wherein the step of determining the position of the first X mirror relative to the second X mirror includes utilizing the measured position of the first fiducial mark relative to the first X mirror and the second X mirror, and the measured position of the second fiducial mark relative to the first X mirror and the second X mirror to determine the relative position of the first and second X mirrors.

29. The method of claim 24 wherein the step of determining the position includes the step of measuring (i) the a position of a first fiducial mark relative to the first X mirror and the second X mirror, (ii) the position of a second fiducial mark relative to the first X mirror and the second X mirror, and (iii) the position of a third fiducial mark relative to the first X mirror and the second X mirror.

30. The method of claim 29 wherein the step of determining the position of the first X mirror relative to the second X mirror includes utilizing the measured position of the first fiducial mark relative to the first X mirror and the second X mirror, the measured position of the second fiducial mark relative to the first X mirror and the second X mirror, and the measured position of the third fiducial mark relative to the first X mirror and the second X mirror to determine the relative position of the first and second X mirrors.

31. A method for making a stage assembly that moves a device, the method comprising the steps of:
providing a device table for retaining the device;
connecting a stage mover assembly to the device table, the stage mover assembly moving the device table in a first direction and in a second direction different from the first direction;
providing a measurement system that monitors a position of the device table, the measurement system including a first X mirror, a second X mirror, and a Y mirror that are secured to the device table;
providing a plurality of fiducial marks for the device table, two fiducial marks of the plurality of fiducial marks have positions that are different from each other both in the first direction and in the second direction; and providing a controller that determines the position of the first X mirror relative to the second X mirror using the plurality of fiducial marks.

32. The method of claim 31 wherein the controller determines the position by measuring (i) the position of a first fiducial mark relative to the first X mirror, the second X mirror, and the Y mirror, and (ii) the position of a second fiducial mark relative to the first X mirror, the second X mirror, and the Y mirror.

33. The method of claim 32 wherein the controller determines the position of the first X mirror relative to the second X mirror by utilizing the measured position of the first fiducial mark relative to the first X mirror, the second X mirror, and the Y mirror, and the measured position of the second fiducial mark relative to the first X mirror, the second X mirror, and the Y mirror.

34. The method of claim 31 wherein the controller determines the position by measuring (i) the position of a first fiducial mark relative to the first X mirror, the second X mirror, and the Y mirror, (ii) the position of a second fiducial mark relative to the first X mirror, the second X mirror, and the Y mirror, and (iii) the position of a third fiducial mark relative to the first X mirror, the second X mirror, and the Y mirror.

35. The method of claim 34 wherein the controller determines the position of the first X mirror relative to the second X mirror by utilizing the measured position of the first fiducial mark relative to the first X mirror, the second X mirror, and the Y mirror, the measured position of the second fiducial mark relative to the first X mirror, the second X mirror, and the Y mirror, and the measured position of the third fiducial mark relative to the first X mirror, the second X mirror, and the Y mirror.

36. A method for making an exposure apparatus that forms an image on a wafer, the method comprising the steps of:

providing an irradiation apparatus that irradiates the wafer with radiation to form the image on the wafer; and providing the stage assembly made by the method of claim 31.

37. A method of making a device comprising the steps of:

providing a first movable stage that moves in a first direction and a second direction different from the first direction, the first movable stage holding a substrate and having a first reflective portion extending in the first direction, a second reflective portion parallel to the first reflective portion, and a first mark portion having a plurality of fiducial marks, two fiducial marks of the plurality of fiducial marks have positions that are different from each other both in the first direction and in the second direction;

providing a first position detector that detects a position of the first movable stage cooperating with the first reflective portion;

providing a first mark detector that detects the plurality of fiducial marks when the first position detector detects the position of the first movable stage;

providing a second position detector that detects a position of the first movable stage cooperating with the second reflective portion;

providing a second mark detector that detects the plurality of fiducial marks when the second position detector detects the position of the first movable stage;

providing a controller that communicates with the first position detector, the second position detector, the first mark detector, and the second mark detector to correlate the first reflective portion with the second reflective portion;

exposing a pattern onto the substrate by a projection system while the substrate is held by the first movable stage; and further processing the substrate on which the pattern has been formed in order to produce the device.

* * * * *